Feb. 27, 1968 E. A. ROSS ET AL 3,371,250

WOVEN CIRCUIT DEVICE

Filed March 9, 1966

INVENTORS:
EDGAR A. ROSS
STANLEY RASK
BY
Curtis, Morris & Safford
ATTORNEYS

United States Patent Office 3,371,250
Patented Feb. 27, 1968

3,371,250

WOVEN CIRCUIT DEVICE

Edgar A. Ross., Greenville, S.C., and Stanley Rask, New York, N.Y., assignors to Southern Weaving Company, Greenville, S.C.

Filed Mar. 9, 1966, Ser. No. 532,940
7 Claims. (Cl. 317—101)

ABSTRACT OF THE DISCLOSURE

The woven circuit device is composed of insulating cloth with interwoven warp and fill wires which touch only at pre-selected crossings. The circuit device is fabricated so that one or more portions of the surface of the cloth have no wires on them and the ends of certain of the warp or fill wires abut the wire-free portions. Electrical circuit components are mounted on the wire-free portions, and the terminals of the components are connected to the adjacent wire ends, thus forming a compact electrical circuit device and flexible mounting structure.

This invention relates to woven circuit devices; more particularly, this invention relates to matrix-form electrical circuit devices formed by weaving techniques.

In recent years significant advances have been made in miniaturizing electrical circuit components. Passive circuit components such as resistors, capacitors and inductors have been significantly reduced in size. More significant size reductions have been attained in the manufacture of active circuit components such as transistors. Entire electrical circuits including several active and passive components have been made in the size of ordinary transistors by the use of "integrated circuit" techniques.

Simultaneously with efforts to miniaturize circuit components, attempts have been made to provide circuit interconnection devices of comparably reduced size. However, such attempts have been somewhat less successful than efforts to miniaturize circuit components.

One circuit interconnection device which presently is quite often used is the "printed circuit board." Such a board usually comprises a relatively stiff panel of insulating material with electrical conductors and component mounting areas formed on the surfaces of the board by printing techniques. Generally speaking, such boards are not entirely satisfactory for use with modern micro-minature circuit components and integrated circuits because the boards require too much surface area for a given amount of circuit interconnection. Such boards have other inherent disadvantages such as requiring inordinately large amounts of engineering effort in designing the conductor printing patterns and setting up manufacturing equipment for each board. The latter feature makes the printed circuit board inordinately expensive except when manufactured in very large quantities.

Various other circuit interconnection devices havee been proposed for solving problems met in the use of printed circuit boards. Examples of such devices are disclosed in U.S. Patents 2,019,625, 2,915,686, 2,977,672, and 3,160,-790. However, such devices have not, it is believed, met with any substantial commercial success because they are too expensive, unreliable, complex, or for various other reasons.

Another interconnection device which has been proposed is a woven circuit comprising interwoven insulating fibers and wires with the wires contacting one another at selected points and being insulated from one another at all other points, thus forming a matrix-form electrical circuit. Circuit components then are connected to the wires at the edges of the fabric. Such an arrangement is shown in the article entitled, "A Woven Circuit Wiring System," by Stanley Rask, in the October 1964 issue of "Electronic Packaging and Production," and in U.S. patent application Ser. No. 478,264, filed Aug. 9, 1965, in the name of Stanley Rask. Although the woven circuits shown in the above publication and patent application are highly satisfactory for many purposes, the present invention provides significant improvements over those circuits.

In view of the foregoing, it is a major object of the present invention to provide circuit interconnection means which is adapted to take full advantage of the small size of modern-day micro-miniature circuit components and circuits. A further object of the present invention is to provide a woven matrix-form circuit device of compact configuration and simple design. Furthermore, it is an object of the present invention to provide such a circuit device which is easily fabricated by the use of automated techniques, is of relatively low cost to use in miniaturizing electrical equipment, and is rugged and reliable.

Further objects and advantages of the present invention will be apparent from or set forth in the following description and drawings in which.

Figures 1, 2, 3, 4, 5, 6:
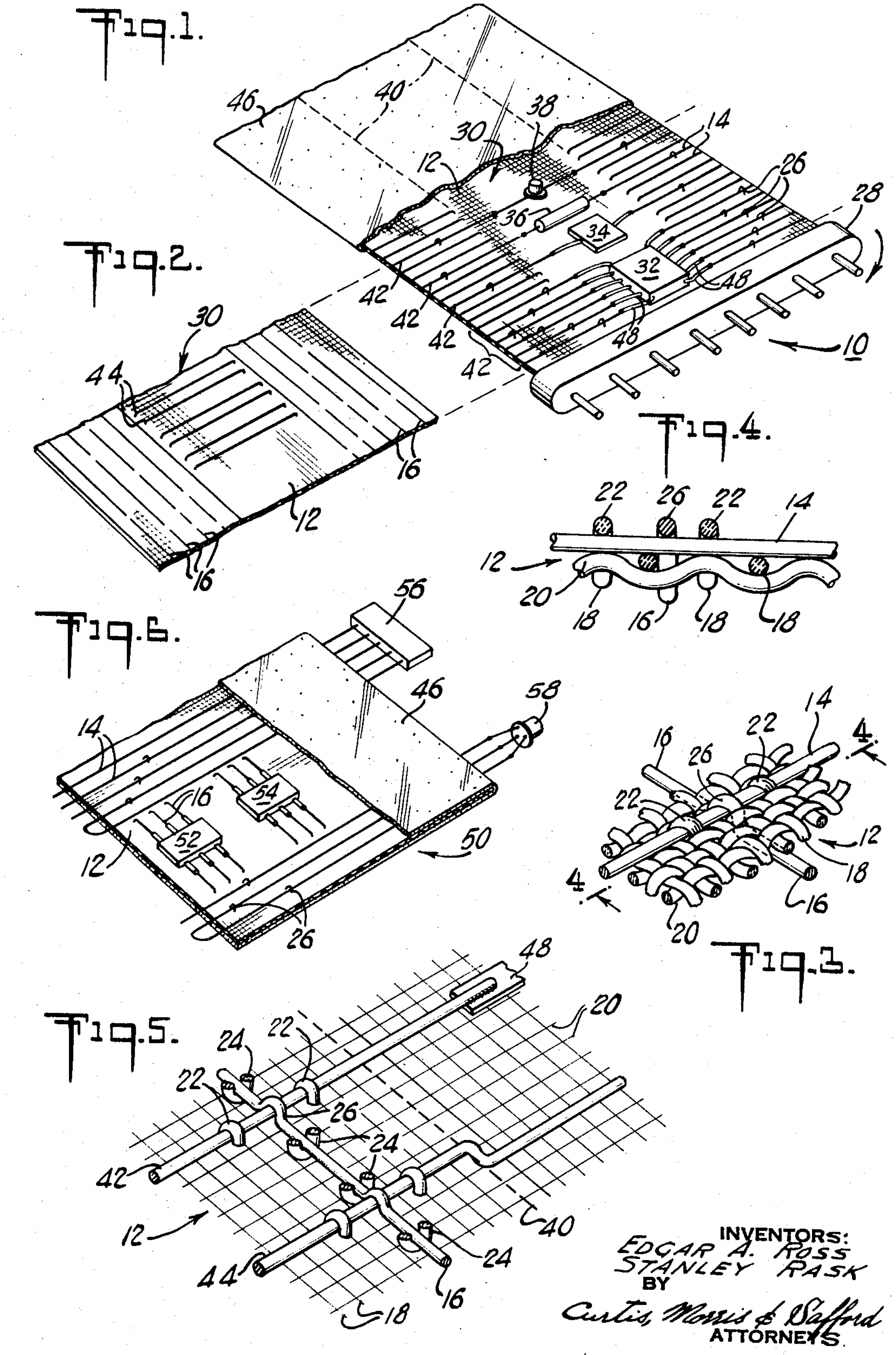
FIGURE 1 is a perspective, partially broken-away view of a woven circuit device of the present invention.
FIGURE 2 is a perspective view of the under-side of a portion of the device shown in FIGURE 1.
FIGURE 3 is an enlarged perspective view of a portion of the device shown in FIGURE 1.
FIGURE 4 is a cross-sectional view taken along line 4—4 of FIGURE 3.
FIGURE 5 is an enlarged perspective and partially-schematic view of another portion of the device shown in FIGURE 1.
FIGURE 6 is a perspective, partially broken-away view of another embodiment of the woven circuit device of the present invention.

The woven circuit device 10 shown in FIGURE 1 comprises a woven insulating fabric 12 in the form of an elongated strip, with wires 14 extending across the strip 12 on its upper surface, and wires 16 (see FIGURE 2) extending longitudinally of the strip 12 on the other side of the fabric. The wires 14 extending across the fabric are called "weft" or "fill" wires, and the longitudinal wires 16 are called "warp" wires.

As is shown most clearly in FIGURES 3, 4 and 5 the fabric 12 consists of insulating warp threads 18 and fill threads 20 woven in a conventional or "standard" weave. The insulating material of which the threads 18 and 20 are made preferably is fiberglass, but can be any other insulating fiber such as cotton or the like.

Each of the fill wires 14 is secured to the upper surface of the fabric 12 by means of loops 22 which are formed by selected warp threads which extend up and over each fill wire at spaced intervals along the length of the wire. Similarly, each warp wire 16 is secured to the underside of the fabric 12 by means of selected fill threads which are formed into loops 24 extending downwardly and over each warp wire at spaced intervals. Thus, the warp and fill wires are secured to opposite sides of the fabric and are everywhere insulated from one another by the fabric. However, at selected crossings between the warp and fill wires, the warp wire 16 passes upwardly through the fabric to form a loop 26 over a selected fill wire, and then passes back through the fabric. A conductive connection is made between a warp and fill wire wherever a loop 26 is thus formed.

The arrangement of the loops 26 is determined in accordance with a desired matrix circuit pattern so as to provide proper interconnection of circuit components to be connected to the wires of the matrix. Wherever circuit connections are not desired, the wires can be cut in two. The location of the circuit "nodes" thus formed by the loops 26 easily can be converted into a punched-card program which then is used to control the loom weaving the fabric and wires together. The woven circuit material thus manufactured can be formed into rolls, and components can be attached as the material flows down an assembly line. A particular circuit may be formed repeatedly in the woven circuit strip and then the strip may be cut into separate sections to form the individual circuit devices. The woven material preferably is dipped into molten solder (after applying an appropriate solder flux material) so as to solder the joints formed by the loops 26 and make them permanent.

As is shown in FIGURE 1, a multi-pin-type connector 28 is connected to the ends of the warp wires at one end of the circuit device 10 to facilitate the connection of the device 10 to other parts of the electrical equipment in which it is used.

In accordance with the present invention, a longitudinal centrally-located strip 30 (see FIGURES 1 and 2) on the upper surface of the fabric is free of both warp and fill wires, thus leaving the fabric 12 bare. Electrical circuit components are mounted on the central portion 30 of the fabric. By way of example, these components include a flat, rectangular-shaped housing 32 enclosing an integrated circuit, a flat mica or semiconductor-type capacitor 34, a resistor 36, and a semiconductor diode 38 in a cylindrical housing.

The central strip 30 is formed in the process of weaving the fabric by omitting the warp wires from the region between the dashed lines 40 (see FIGURE 1) and omitting loops 22 of weft threads which normally would secure the central portions of selected fill wires 42 to the fabric 12. Thus, the fill wires 42 are not secured to the fabric in the space between the dashed lines 40. Other fill wires 44, which are located between the components 32, 34, 36 and 38 pass downwardly through the fabric, under the strip 30, and upwardly again through the fabric (see FIGURES 2 and 5). A centrally-located segment is removed from each of the fill wires 42 on the upper surface of the fabric. The length of this segment is substantially less than the width of the strip 30, thus leaving the ends of the fill wires 42 extending into the strip area 30. These wire ends are free from the fabric 12 and are relatively easy to connect to the circuit elements 32, 34, etc. The lead wires of the circuit components then are soldered to the free end of the fill wires 42. This not only properly connects the components into the matrix circuit, but also secures the components onto the insulating surface formed by the bare central portion 30 of the fabric 12. The components also can be connected to the wires by crimping or other well-known connecting methods.

After the components have been connected into the device 10, a coating 46 of insulating plastic material is placed over the whole device so as to encapsulate and protect it. Suitable encapsulation materials include epoxy resins polyesters, plastisols, polyvinyl chlorides, silicone compounds, and other well-known encapsulation materials. Preferably, such materials are relatively flexible upon hardening so that the circuit device 10 can be folded and bent into a desired shape to facilitate its mounting in the electrical equipment in which it is to be installed.

The fill wires 44 extending across the underside of the central portion 30 are arranged in this manner in order that cross-connections can be made between various portions of the circuit on both sides of the central portion 30. If, however, such connections are not desired, these fill wires can be cut off when the other fill wires are cut.

The connection of the "flat-pack" integrated circuit element 32 is of special interest. The normal flat-pack housing has a plurality of flat lead conductors 48 such as those shown in FIGURES 1 and 5. The leads 48 are spaced very close to one another, such as at distances of 50 mils (thousandths of an inch) from one another. The fill wires 14 are shown in FIGURE 1 with relatively wide spacings between them for the sake of clarity. However, the fill wires can be quite closely spaced to one another without creating any significant danger of short circuiting; a spacing of 50 mils easily is attainable. Thus, the flat-pack 32 easily can be aligned with and soldered to the fill wires.

FIGURE 6 shows another woven circuit device 50 constructed in accordance with the present invention. The circuit device 50 is basically quite similar to the device 10 shown in FIGURE 1, and the same reference numerals are used to identify corresponding parts of the two devices.

The main difference between the two devices 50 and 10 is that in the device 50 bands of bare fabric 12 are formed across the fabric instead of longitudinally of the fabric as in the device 10. Such bands of bare insulating fabric are formed by omitting groups of fill wires from the upper surface of the structure at spaced intervals along the length oft he fabric. The warp wires 16 pass upwardly through the fabric at one edge of each band and downwardly through the fabric at the other edge of the band. Centrally-located segments are cut from each of the warp wires thus appearing on the upper surface of the bare fabric, and electrical circuit components 52 and 54 are connected to the warp wire ends and thus are mounted on the insulating surface and connected into the woven circuit.

If desired, the ends of the fill wires may be allowed to extend beyond the lateral edges of the fabric 12 as shown in FIGURE 6. Then, circuit components such as components 56 and 58 can be connected to the fill wire ends extending from the fabric. Also, the ends of adjacent fill wires can be connected together to form further circuit connections.

Preferably, selected warp wires are allowed to remain on the bottom surface of the fabric 12 to perform a function similar to that of the fill wires 44 shown in FIGURE 2. That is, such warp wires can be located between the circuit components 52 and 54 in order to provide interconnections between longitudinally-spaced groups of fill wires.

The above-described woven circuit devices have many advantages over prior art circuit interconnection devices. The devices of the present invention are quite compact and provide relatively great numbers of circuit interconnections in a relatively small surface area. It is believed that in many circuits one of the present woven circuit devices will perform the same function as several printed circuit boards. Furthermore, since the circuit devices are woven on automatic programmed looms, the substantial amount of engineering design usually required to produce printed circuit boards is eliminated. Furthermore, the present circuit device provides a stable, solid insulating mounting surface for the circuit components within the confines of the woven structure, thus increasing circuit reliability and structure stability, and reducing the volume occupied by the circuit device. The mounting of components between opposite sets of fill or warp wires is extremely convenient for making connections to circuit components having leads extending from opposite sides of the components.

The circuit device of the present invention is flexible and has inherent resistance to destruction due to vibration, bending and other sources of physical deformations. The device can be folded, bent, and formed into a multitude of shapes specially adapted to fit into the equipment for which it is designed.

The above description of the invention is intended to be illustrative and not limiting. Various changes or modifications in the embodiments described may occur to those skilled in the art and these can be made without departing from the spirit or scope of the invention as set forth in the claims.

We claim:

1. A woven circuit device, said device comprising, in combination, a woven fabric of insulating threads, conductive warp and fill wires interwoven with said insulating threads in a predetermined matrix pattern in which the warp and fill wires make conductive contact with one another only at preselected crossings and are insulated from one another by said fabric at all other crossings, said woven fabric having a wire-free surface portion with the ends of pre-selected ones of said wires abutting said wire-free portion, an electrical circuit component mounted upon said wire-free portion of said fabric with its electrical terminals conductively secured to said abutting wire ends.

2. A device as in claim 1 in which said circuit component has a plurality of substantially parallel spaced-apart leads extending outwardly from one of its sides, said abutting wire ends having the same relative spacing as said leads.

3. A device as in claim 2 in which said circuit component is an integrated circuit housed in a flat package with leads extending from two opposite sides of said flat package.

4. A device as in claim 1 in which selected ones of said warp and fill wires lie upon a surface of said fabric which is opposite to said wire-free surface portion so as to avoid contact with the circuit component on said wire-free portion.

5. A device as in claim 1 in which said wire-free portion is in the form of a strip extending in the direction of said fill wires, with said abutting wire ends being warp wire ends.

6. A device as in claim 1 in which said wire-free portion is in the form of a strip extending in the direction of said warp wires, with said abutting wire ends being fill wire ends.

7. A woven circuit device, said device comprising, in combination, a woven fabric of insulating threads, said fabric being in elongated strip form, warp and fill wires interwoven with said insulating threads in a predetermined matrix pattern in which the warp and fill wires are secured to opposite sides of said fabric and selected wires pass through said fabric, around a wire in the opposite surface, and back through the fabric so that said wires make conductive contact with one another only at preselected crossings and are insulated from one another by said fabric at all other crossings, said woven fabric having a wire-free surface portion extending longitudinally of said fabric approximately in its center with fill wire ends abutting said wire portion on both sides, an integrated circuit flat package on said wire-free portion, said flat package having spaced leads on opposite sides connected to abutting wire ends on opposite sides of said wire-free portion, and a terminal connector at one end of said fabric with connector pins connected to warp wires in said circuit device.

References Cited

UNITED STATES PATENTS 3,255,047 6/1966 Escoffery ........... 317—101

OTHER REFERENCES

Tebbenhoff, German printed application, 1,175,761, August 1964.

DARRELL L. CLAY, *Primary Examiner.*